(12) United States Patent
Lee et al.

(10) Patent No.: US 9,899,422 B2
(45) Date of Patent: Feb. 20, 2018

(54) THIN FILM TRANSISTOR SUBSTRATE AND DISPLAY DEVICE INCLUDING THE SAME

(71) Applicant: Samsung Display Co., Ltd., Yongin-si, Gyeonggi-do (KR)

(72) Inventors: Jaehak Lee, Yongin-si (KR); Sungin Ro, Yongin-si (KR); Eunje Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 85 days.

(21) Appl. No.: 15/002,574

(22) Filed: Jan. 21, 2016

(65) Prior Publication Data
US 2016/0380004 A1 Dec. 29, 2016

(30) Foreign Application Priority Data

Jun. 25, 2015 (KR) .................. 10-2015-0090493

(51) Int. Cl.
G02F 1/136 (2006.01)
H01L 27/12 (2006.01)
G02F 1/1368 (2006.01)
G02F 1/1362 (2006.01)

(52) U.S. Cl.
CPC ........ H01L 27/1225 (2013.01); G02F 1/1368 (2013.01); G02F 1/136204 (2013.01); G02F 1/136227 (2013.01); G02F 1/136286 (2013.01); H01L 27/124 (2013.01); G02F 2001/13629 (2013.01)

(58) Field of Classification Search
None
See application file for complete search history.

(56) References Cited

U.S. PATENT DOCUMENTS

2014/0141574 A1 5/2014 Zhan et al.
2015/0268516 A1* 9/2015 Miyachi ............ G02F 1/133788
349/187

FOREIGN PATENT DOCUMENTS

KR 1020000027714 A 5/2000
KR 1020010010518 A 2/2001
KR 1020040098869 A 11/2004

* cited by examiner

Primary Examiner — Richard Kim
(74) Attorney, Agent, or Firm — Cantor Colburn LLP

(57) ABSTRACT

A thin film transistor substrate includes a base substrate, a first metallic layer including a gate electrode of a thin film transistor and an island electrode spaced apart from the gate electrode on the base substrate, a semiconductor layer of which a portion thereof overlaps the gate electrode of the first metallic layer, and a second metallic layer including a source electrode and a drain electrode of the thin film transistor which are spaced apart from each other on the portion of the semiconductor layer. The source electrode of the thin film transistor overlaps the island electrode.

16 Claims, 9 Drawing Sheets

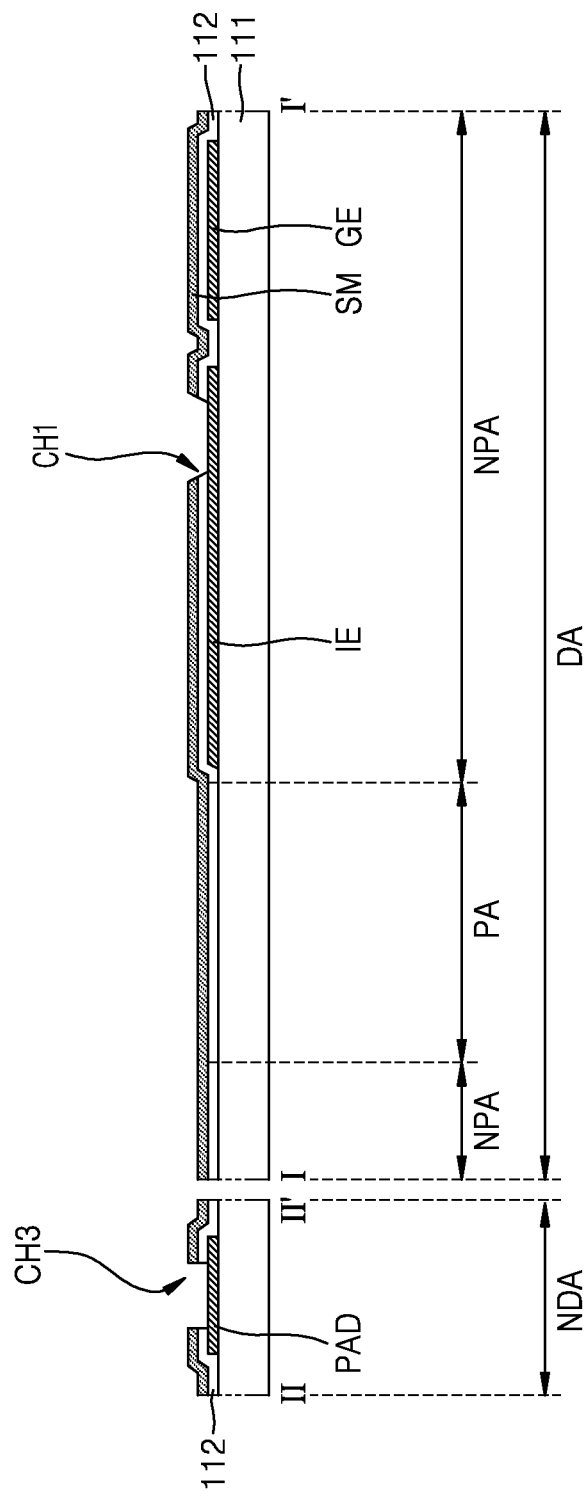

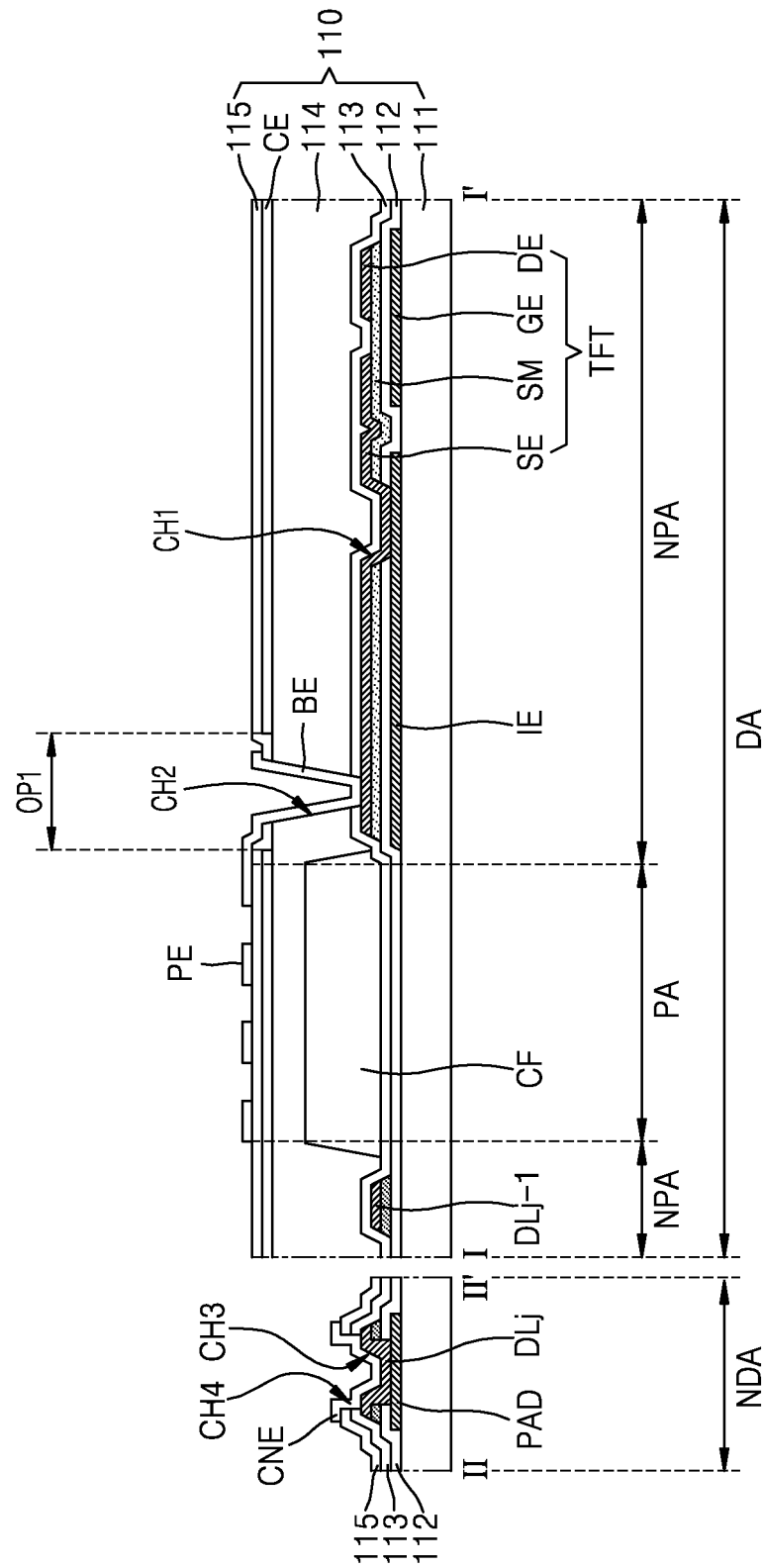

THIN FILM TRANSISTOR SUBSTRATE AND DISPLAY DEVICE INCLUDING THE SAME

This application claims priority to Korean Patent Application No. 10-2015-0090493, filed on Jun. 25, 2015, and all the benefits accruing therefrom under 35 U.S.C. § 119, the contents of which in their entirety are herein incorporated by reference.

BACKGROUND

1. Field

One or more exemplary embodiments relate to a thin film transistor substrate and a display device including the same.

2. Description of the Related Art

Generally, a display device includes a plurality of pixels and an image display layer driven by the pixels. Various image display layers, such as a liquid crystal layer, an electrowetting layer and an electrophoresis layer, may be used as the image display layer.

Each of the pixels includes a pixel electrode connected to a thin film transistor and a common electrode that receives a common voltage. The thin film transistor is turned on by a gate signal. The turned-on thin film transistor receives a data voltage and provides the same to the pixel electrode. The image display layer is driven by an electric field formed by the pixel electrode that receives the data voltage and the common electrode that receives the common voltage, thereby displaying an image.

When the thin film transistor is turned on by a gate signal, a micro-arc may be generated in the thin film transistor and the temperature of the thin film transistor may increase due to the micro-arc. Thus, a function of the thin film transistor may deteriorate.

SUMMARY

Additional features will be set forth in part in the description which follows and, in part, will be apparent from the description, or may be learned by practice of the presented embodiments.

According to one or more exemplary embodiments, a thin film transistor substrate includes: a base substrate; a first metallic layer including a gate electrode of a thin film transistor and an island electrode spaced apart from the gate electrode on the base substrate; a semiconductor layer of which a portion thereof overlaps the gate electrode of the first metallic layer; and a second metallic layer including a source electrode and a drain electrode of the thin film transistor spaced apart from each other on the portion of the semiconductor layer. The source electrode of the thin film transistor overlaps the island electrode.

The source electrode which overlaps the island electrode may directly contact the island electrode.

The thin film transistor substrate may further include: a first insulating layer between the gate electrode and the portion of the semiconductor layer and in which a contact hole is defined at an overlapping region of the source electrode and the island electrode. The source electrode and the island electrode may directly contact each other at the contact hole defined in the first insulating layer.

A contact hole may be defined in the portion of the semiconductor layer at the overlapping region of the source electrode and the island electrode, and the source electrode and the island electrode may directly contact each other at the contact hole defined in the semiconductor layer and at the contact hole defined in the first insulating layer.

The thin film transistor substrate may further include: a plurality of pixels, and each of the pixels may include the island electrode and the thin film transistor including the gate electrode, the portion of the semiconductor layer, the source electrode and the drain electrode.

The first metallic layer may further include the gate electrode provided in plural electrically connected to each other, and the island electrode provided in plural electrically insulated from each other and from the plural gate. The plural island electrodes and the plural gate electrodes may be alternately arranged.

The first metallic layer may further include a gate line extending along a row direction, and the gate line may define the plural gate electrodes electrically connected to each other in the row direction and electrically insulated from and alternately arranged with the plural island electrodes.

The thin film transistor substrate may further include: a third metallic layer on the second metallic layer and including a pixel electrode electrically connected to the source electrode of the thin film transistor.

The base substrate may include a display area in which an image is displayed and in which pixels are arranged, and a non-display area which is adjacent to the display area. The first metallic layer may further include a pad electrode in the non-display area, and the second metallic layer may further include a data line which directly contacts the pad electrode.

The second metallic layer may further include the source electrode provided in plural, the drain electrode provided in plural electrically connected to each other, and the data line extending along a column direction. The data line may define the plural drain electrodes electrically connected to each other in the column direction.

The semiconductor layer may include an oxide semiconductor.

The oxide semiconductor may include an indium-gallium-zinc oxide.

According to one or more exemplary embodiments, a display device includes: a first display substrate which defines a display area in which a plurality of pixels is arranged, and a non-display area which surrounds the display area; a second display substrate facing the first display substrate; and a liquid crystal layer between the first display substrate and the second display substrate facing each other. Each of the pixels includes: a first metallic layer including a gate electrode of a thin film transistor and an island electrode spaced apart from the gate electrode on a base substrate; a semiconductor layer of which a portion thereof overlaps the gate electrode of the first metallic layer; and a second metallic layer including a source electrode and a drain electrode of the thin film transistor spaced apart from each other on the portion of the semiconductor layer. The source electrode of the thin film transistor overlaps the island electrode.

The source electrode which overlaps the island electrode may directly contact the island electrode.

The display device may further include: a first insulating layer between the gate electrode and the portion of the semiconductor layer and in which a contact hole is defined at an overlapping region of the source electrode and the island electrode. The source electrode and the island electrode may directly contact each other at the contact hole defined in the first insulating layer.

A contact hole may be defined in the portion of the semiconductor layer at the overlapping region of the source electrode and the island electrode, and the source electrode and the island electrode may directly contact each other at the contact hole defined in the portion of the semiconductor layer and at the contact hole defined in the first insulating layer.

Each of the pixels may further include a third metallic layer on the second metallic layer and including a pixel electrode electrically connected to the source electrode of the thin film transistor.

Each of the pixels may further include: the thin film transistor including the gate electrode, the portion of the semiconductor layer, the source electrode and the drain electrode; the island electrode which directly contacts the source electrode; and the pixel electrode which is electrically connected to the source electrode.

The first metallic layer may further include a pad electrode in the non-display area, and the second metallic layer may further include a data line which directly contacts the pad electrode and electrically connects the drain electrode in the display area with the pad electrode in the non-display area.

The semiconductor layer may include an oxide semiconductor.

BRIEF DESCRIPTION OF THE DRAWINGS

These and/or other features will become apparent and more readily appreciated from the following description of the exemplary embodiments, taken in conjunction with the accompanying drawings in which:

FIGS. 5A to 5E are cross-sectional views for explaining an exemplary embodiment of a method of manufacturing a thin film transistor substrate of a display device according to the invention.

DETAILED DESCRIPTION

Figure 1:
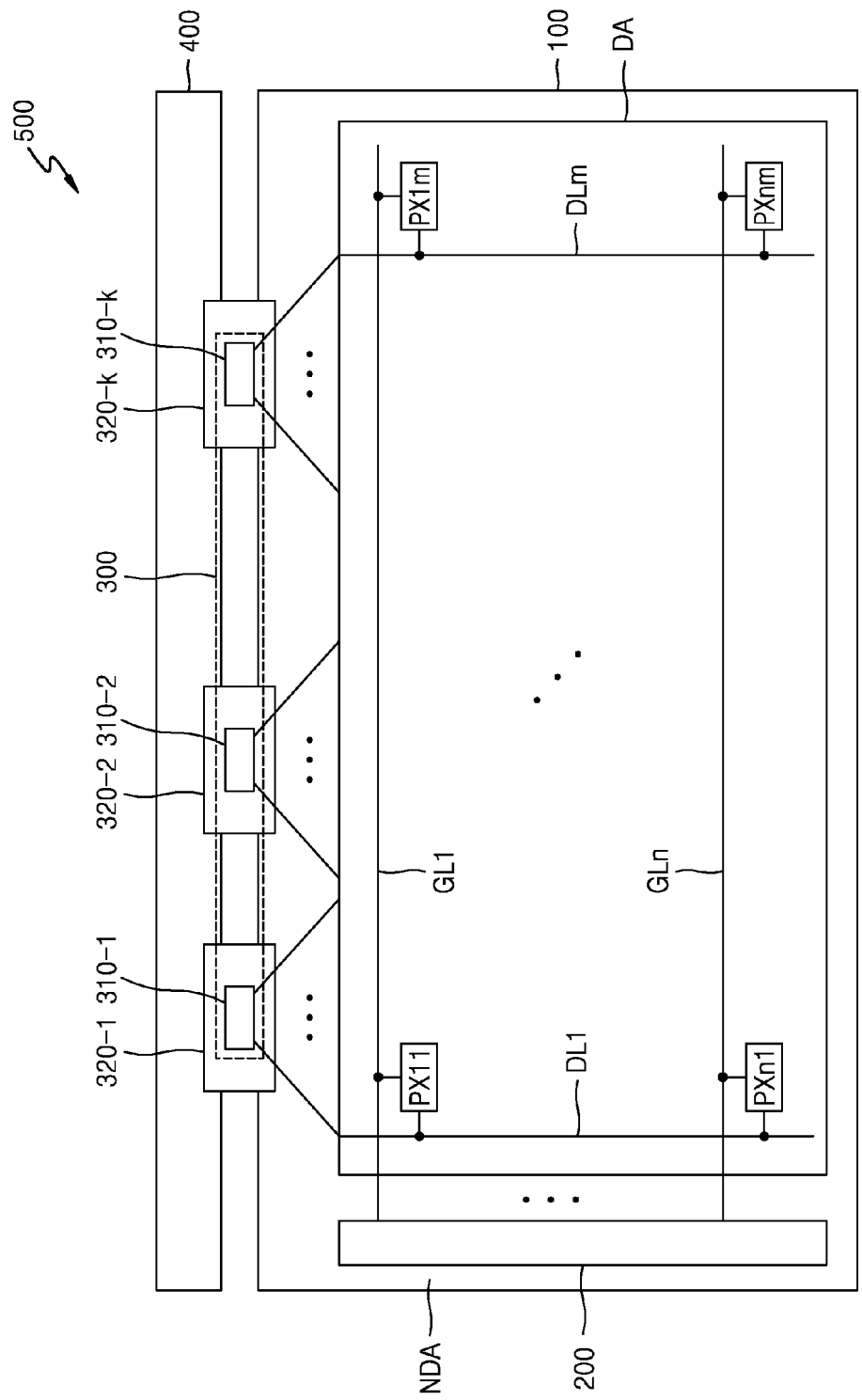
FIG. 1 is a schematic top plan view illustrating an exemplary embodiment of a display device according to the invention.

As the invention allows for various changes and numerous embodiments, exemplary embodiments will be illustrated in the drawings and described in detail in the written description. An effect and a characteristic of the invention, and a method for accomplishing these will be apparent when exemplary embodiments described below in detail are referred together with the drawings. However, the invention is not limited to exemplary embodiments described below and may be implemented in various forms.

It will be understood that when an element or a layer is referred to as being "on" another element or another layer, the element can be directly on the other element or layer, or intervening elements may be present thereon. In contrast, it will be understood that when an element or a layer is referred to as being "directly on" another element or another layer, intervening elements are not present thereon. "and/or" includes each of referred components and all combination of one or more components.

Furthermore, "below," "beneath," "lower," "above," "upper," etc., which are spatially relative terms, may be used to easily describe position relation between one device or components and another device or other components as illustrated in the drawings. When a spatially relative term is used in addition to a direction illustrated in the drawings, the term should be understood as a term including different directions of the device.

While such terms as "first," "second," etc., may be used to describe various components, such components must not be limited to the above terms. The above terms are used only to distinguish one component from another. Therefore, a first component referred below may be a second component within the scope of the invention.

The singular forms "a," "an" and "the" are intended to include the plural forms as well, including "at least one," unless the context clearly indicates otherwise. As used herein, the term "and/or" includes any and all combinations of one or more of the associated listed items It will be further understood that the terms "comprises" and/or "comprising" used herein specify the presence of stated features or components, but do not preclude the presence or addition of one or more other features or components.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described with reference to ideal schematic plan views and cross-sectional views. The shape of an exemplary view may be transformed by a manufacturing technology and/or a tolerance, etc. Exemplary embodiments are not limited to illustrated specific forms but include changes of a form generated depending on a manufacturing process. Therefore, regions exemplified in the drawings have a schematic attribute, and the shape of regions exemplified in the drawings is for exemplifying a specific shape of a region of a device, and not for limiting the scope of the invention.

Hereinafter, exemplary embodiments are described in detail with reference to the accompanying drawings. Like reference numerals are used for like or corresponding elements when description is made with reference to the drawings, and repeated description thereof is omitted.

FIG. 1 is a schematic top plan view illustrating an exemplary embodiment of a display device 500 according to the invention.

Referring to FIG. 1, the display device 500 may include a display panel 100, a gate driving portion 200, a data driving portion 300 and a driving circuit substrate 400.

The display panel 100 may include a plurality of pixels PX11-PXnm, a plurality of gate lines GL1-GLn and a plurality of data lines DL1-DLm. The display panel 100 may include a display area DA in which an image is displayed and a non-display area NDA surrounding the display area DA and in which an image is not displayed.

The pixels PX11-PXnm are arranged in a matrix configuration in the display area DA of the display panel 100. In an exemplary embodiment, for example, the pixels PX11-PXnm may be arranged in "n" rows and "m" columns that cross each other. Here, "m" and "n" are integers greater than 0.

The gate lines GL1-GLn and the data lines DL1-DLm are insulated from each other in a thickness direction of the display panel 100 and are arranged to cross each other in the top plan view of the display panel 100. The gate lines GL1-GLn are connected to the gate driving portion 200 and receive gate signals from the gate driving portion 200. The data lines DL1-DLm are connected to the data driving portion 300 and receive analog data voltages from the data driving portion 300.

The pixels PX11-PXnm are connected to corresponding gate lines GL1-GLn and corresponding data lines DL1-DLm, respectively. The pixels PX11-PXnm receive data voltages via the corresponding data lines DL1-DLm in response to gate signals transferred via the corresponding gate lines GL1-GLn. The pixels PX11-PXnm display gray scales corresponding to data voltages.

The gate driving portion 200 generates the gate signals in response to a gate control signal from a timing controller (not shown) mounted on the driving circuit substrate 400, and sequentially provides the gate signals to the pixels PX11-PXnm via the gate lines GL1-GLn on a row basis.

The gate driving portion 200 may be disposed in the non-display area NDA of the display panel 100 that neighbors the display area DA. Though the gate driving portion 200 is disposed on the left of the display area DA, this is exemplary and the gate driving portion 200 may be disposed in a portion of the non-display area NDA that neighbors the right side or both the left and right sides of the display area DA.

The gate driving portion 200 may include a plurality of gate driving chips (not shown). The gate driving chips may be mounted in a portion of the non-display area NDA of the display panel 100 that neighbors the left of the display area DA by using a chip on glass ("COG") method. However, the gate driving chips may be connected in a portion of the non-display area NDA that neighbors the display area DA by using a tape carrier package ("TCP") method.

The data driving portion 300 receives image signals and a data control signal from the timing controller. The data driving portion 300 generates analog data voltages corresponding to the image signals in response to the data control signal. The data driving portion 300 provides the data voltages to the pixels PX11-PXnm via the data lines DL1-DLm.

The data driving portion 300 may include a plurality of source driving chips 310_1-310_k. Here, "k" is an integer greater than 0 and less than "m." The source driving chips 310_1-310_k are mounted on corresponding flexible printed circuit boards 320_11-320_k and connected to the non-display area NDA of the display panel 100 that neighbors the display area DA via the driving circuit substrate 400. Though the data driving portion 300 is illustrated connected to a portion of the non-display area NDA that neighbors the upper side of the display area DA, this is exemplary, and the data driving portion 300 may be connected to a portion of the non-display area NDA that neighbors the upper side or both the upper and lower sides of the display area DA via the driving circuit substrate 400.

The data driving portion 300 may be connected to the display panel 100 by using the tape carrier package ("TCP") method. However, the data driving portion 300 is not limited thereto and the source driving chips 310_1-310_k may be mounted in a portion of the non-display area NDA of the display panel that neighbors the upper portion of the display area DA by using the chip on glass ("COG") method.

Though not shown, the data lines DL1-DLm may be connected to the source driving chips 310_1-310_k via pad electrodes disposed in the non-display area NDA of the display panel 100. Also, the gate lines GL1-GLn may be connected to the gate driving portion 200 via pad electrodes disposed in the non-display area NDA of the display panel 100.

Figure 2:
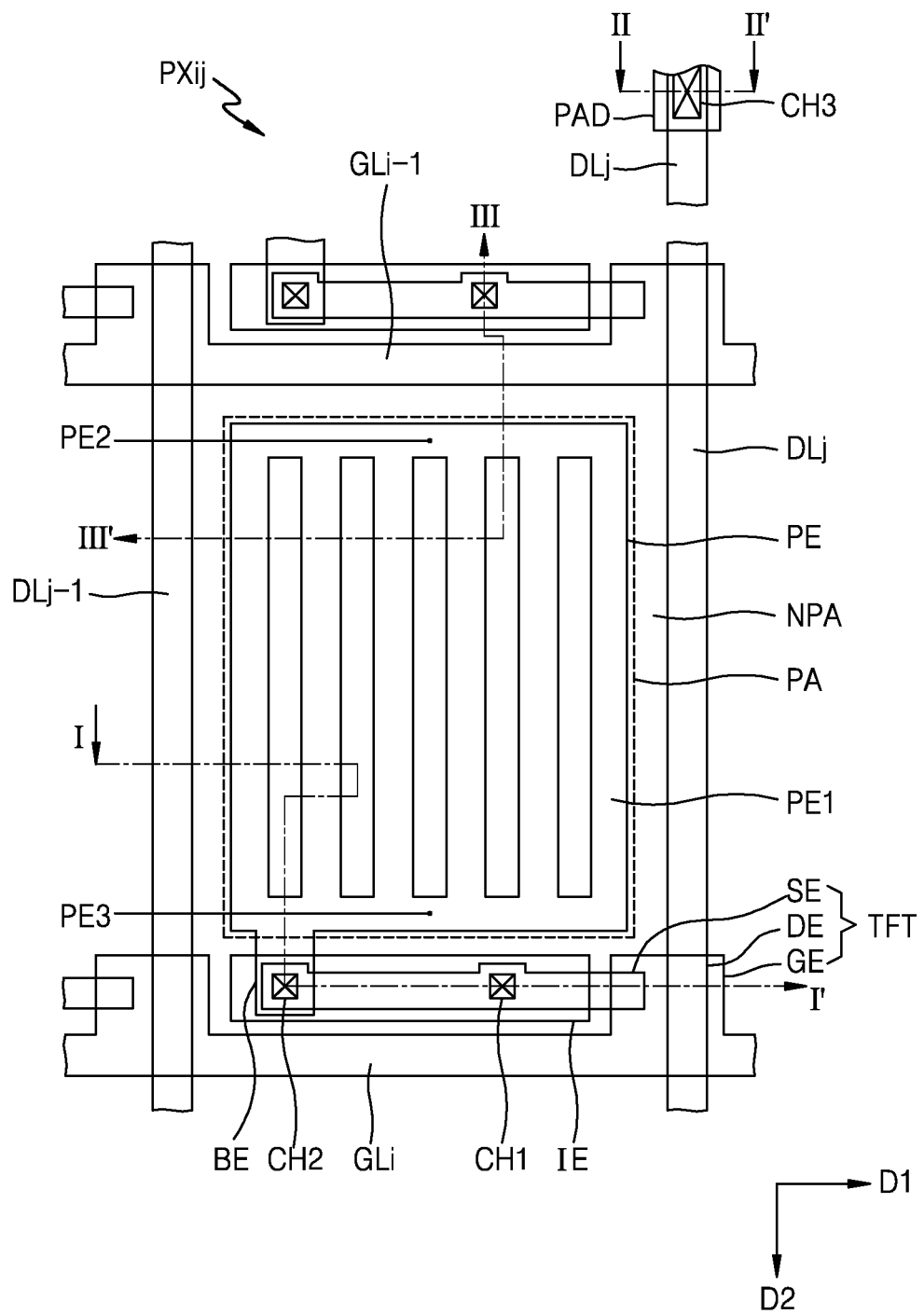
FIG. 2 is a top plan view illustrating an exemplary embodiment of a pixel of a display device according to the invention.

FIG. 2 is a plan view illustrating an exemplary embodiment of a pixel of a display device according to the invention.

Though one pixel PXij is exemplarily illustrated in FIG. 2, other pixels among the pixels PX11-PXnm illustrated in FIG. 1 may have the same construction. Hereinafter, the construction of one pixel PXij is described for convenience in description.

Referring to FIG. 2, a region of the pixel PXij in the top plan view includes a pixel area PA and a non-pixel area NPA that neighbors the pixel area PA. The pixel area PA may be defined as an area at which an image is displayed, and the non-pixel area NPA may be defined as an area at which an image is not displayed. The non-pixel area NPA may be defined as an area between pixel adjacent areas PA.

Gate lines GLi-1 and GLi, and data lines DLj-1 and DLj are disposed in the non-pixel area NPA of the pixel PXij. Lengths of the gate lines GLi-1 and GLi extend in a first direction D1. Lengths of the data lines DLj-1 and DLj extend in a second direction D2 that crosses the first direction D1. The data lines DLj-1 and DLj are insulated from the gate lines GLi-1 and GLi and cross the gate lines GLi-1 and GLi. Here, """ is an integer greater than 0 and equal to or less than ":n." Further, "j" is an integer greater than 0 and equal to or less than "m."

The pixel PXij includes a thin film transistor TFT and a pixel electrode PE which is connected to the thin film transistor TFT. The thin film transistor TFT is disposed in the non-display area NPA of the pixel PXij. The pixel electrode PE is disposed in the pixel area PA of the pixel PXij. The thin film transistor TFT of the pixel PXij is connected to a corresponding gate line GLi and a corresponding data line DLj.

The thin film transistor TFT includes a gate electrode GE connected to the gate line GLi, a drain electrode DE connected to the data line DLj, and a source electrode SE connected to the pixel electrode PE. The gate electrode GE branches off from a main portion of the gate line GLi such that a portion of the gate line GLi defines the gate electrode GE. The drain electrode DE is defined as a portion of the data line DLj that overlaps the gate electrode GE at least partially. The source electrode SE overlaps the gate electrode GE at least partially and is spaced apart from the drain electrode DE which is on the gate electrode GE.

The pixel PXij includes an island electrode IE. Not only the pixel PXij illustrated in FIG. 2 but also each of other pixels among the pixels PX11-PXnm illustrated in FIG. 1 includes at least one island electrode IE.

The island electrode IE includes the same material as that of the gate electrode GE and is disposed in a same layer in which the gate electrode GE is disposed. The island electrode IE overlaps the source electrode SE of the thin film transistor TFT at least partially. According to an exemplary embodiment, the source electrode SE may directly contact the island electrode IE. According to another exemplary embodiment, as illustrated in FIG. 2, the source electrode SE may directly contact the island electrode IE at a first contact hole CH1.

The island electrode IE may be disposed inside the non-pixel area NPA of the pixel PXij. The island electrode IE is insulated from the gate electrode GE and the gate line GLi in a thickness direction of the display panel 100. Island electrodes IE of adjacent pixels are electrically insulated from each other. The island electrodes IE and the gate electrodes GE are alternately arranged along the first direction D1 such that they are electrically insulated from each other.

A length of the island electrode IE may extend along the first direction D1. Though the island electrode IE is illustrated to extend up to the lower portion of and even overlapping a second contact hole CH2 in FIG. 2, this is exemplary, and the size of the island electrode IE is not limited thereto.

When the thin film transistor TFT is turned on, micro-arc may occur inside the thin film transistor TFT. The temperature of a channel region of the thin film transistor TFT may rise due to the micro-arc. Where the thin film transistor TFT uses a semiconductor material that is vulnerable to heat for the channel region, the semiconductor material may undesirably deteriorate due to the micro-arc and high temperature. According to an exemplary embodiment, rising of the temperature of the channel region may be prevented or minimized by emitting heat therefrom via the island electrode IE. Since the source electrode SE includes a material having a relatively high thermal conductivity and directly connects the channel region of the thin film transistor TFT with the island electrode IE, heat generated from the channel region of the thin film transistor TFT may be easily emitted therefrom via the island electrode IE.

The source electrode SE is electrically connected to the pixel electrode PE at the second contact hole CH2. A portion of the pixel electrode PE in the display area DA of the pixel PXij extends to the non-pixel area NPA and is connected to the source electrode SE of the thin film transistor TFT at the second contact hole CH2 in the non-pixel area NPA. The extended portion of the pixel electrode PE defines a branch electrode BE thereof that protrudes from a main portion of the pixel electrode PE. The branch electrode BE is connected to the source electrode SE of the thin film transistor TFT at the second contact hole CH2. The branch electrode BE is disposed in the non-pixel area NPA.

The pixel electrode PE includes defined therein a plurality of branch portions PE1, a first connection portion PE2, and a second connection portion PE3. The branch portions PE1 are spaced apart from each other in the first direction D1 by substantially a same distance, and lengths of the branch portions PE1 each extend in the second direction D2. Lengths of the first and second connection portions PE2 and PE3 extend in the first direction D1. The first connection portion PE2 connects first distal ends of the branch portions PE1 to each other, and the second connection portion PE3 connects second distal ends of the branch portions PE1 opposing the first ends thereof to each other. Portions of the pixel electrode PE may define not only the branch electrode BE described above, but also the plurality of branch portions PE1 thereof, the first connection portion PE2 thereof and the second connection portion PE3 thereof.

The length of the data line DLj extends in the second direction D2 and a distal end of the data line DLj is connected to a pad electrode PAD at a third contact hole CH3. Though not shown, the pad electrode PAD is electrically connected to a connection electrode, and the connection electrode is electrically connected to a source driving chip. Therefore, a data voltage output from the source driving chip may be applied to the data line DLj via the pad electrode PAD. The pad electrode PAD is disposed in a same layer in which the gate electrode GE is disposed. This construction is described below.

Though not shown, a distal end of the gate line GLi may be also connected to a pad electrode (not shown) disposed in the same layer in which the gate electrode GE and the pad electrode PAD is disposed. A gate signal output from the gate driving portion 200 may be applied to the gate line GLi via the pad electrode PAD.

Though not shown in FIG. 2, a common electrode may be disposed in the pixel PXij. The common electrode includes a first opening OP1 defined therein. The size of the first opening OP1 in plan view is larger than that of the second contact hole CH2. This construction is described below. Portions of the common electrode may define the first opening OP1 thereof.

Figure 3:
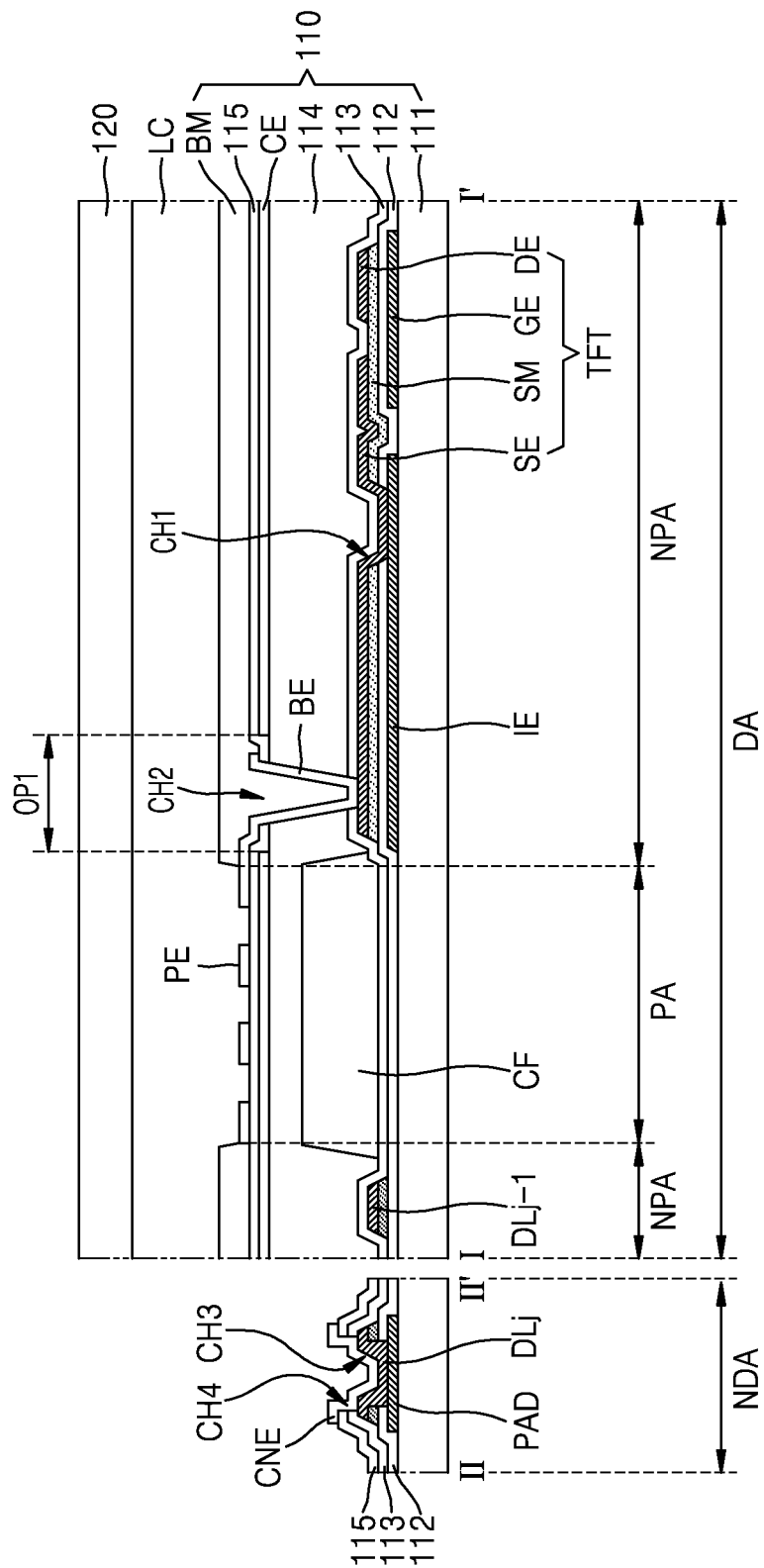
FIG. 3 is a cross-sectional view of the display device taken along lines I-I' and II-II' of FIG. 2.
Figure 4:
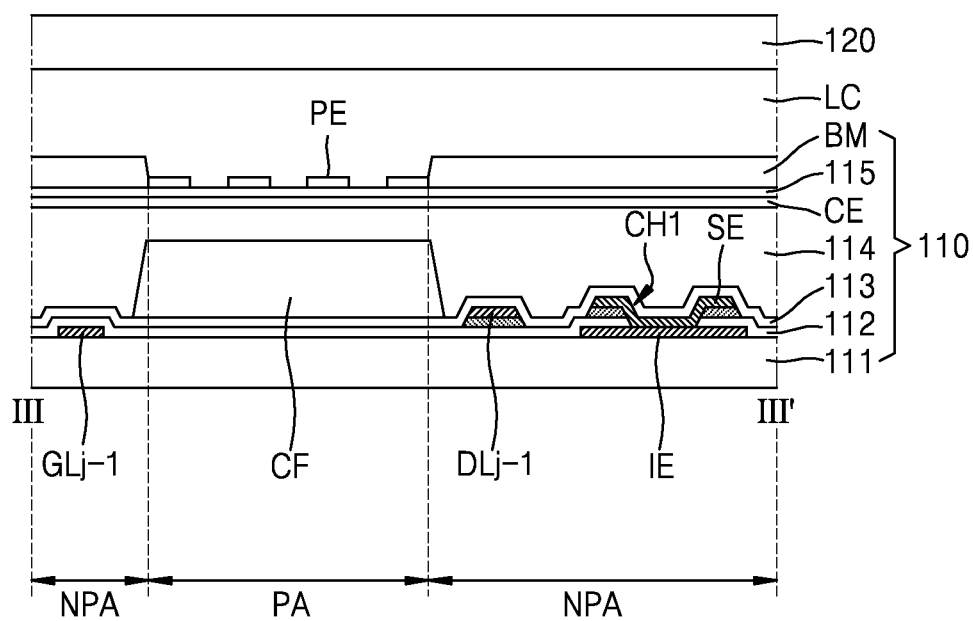
FIG. 4 is a cross-sectional view of the display device taken along line III-III' of FIG. 2.

FIG. 3 is a cross-sectional view taken along lines I-I' and II-II' of FIG. 2. FIG. 4 is a cross-sectional view taken along line III-III' of FIG. 2.

Referring to FIGS. 3 and 4, the display panel 100 includes a first display substrate 110, a second display substrate 120 facing the first display substrate 110, and an image display layer LC disposed between the first display substrate 110 and the second display substrate 120. The first display substrate 110 may be referred to as a thin film transistor substrate. The plurality of pixels PX11-PXnm may be arranged in the first display substrate 110. In the illustrated exemplary embodiment, the image display layer LC is described as a liquid crystal ("LC") layer.

The first display substrate 110 includes a base substrate 111, the thin film transistor TFT provided in plural, a color filter CF, first to fourth insulating layers 112, 113, 114 and 115, a common electrode CE, the pixel electrode PE and a black matrix BM.

The base substrate 111 of the first display substrate 110 may include a display area DA in which the pixels PX11-PXnm are disposed, and a non-display area NDA that neighbors the display area DA. Also, the display area DA of the base substrate 111 includes pixel areas PA and non-pixel areas NPA which are between the pixel areas PA.

The island electrode IE, the gate electrode GE of the thin film transistor TFT, and the gate line GLi-1 are disposed on a portion of the base substrate 111 that corresponds to the non-pixel area NPA. As illustrated in FIG. 2, the gate electrode GE branches off from a main portion of the gate line GLi. A pad electrode PAD is disposed on a portion of the base substrate 111 that corresponds to the non-display area NDA. The island electrode IE, the gate electrode GE, the gate lines GLi-1 and GLi, and the pad electrode PAD may include the same material and may be disposed in a same layer of the first display substrate 110 among layers disposed on the base substrate 111. In an exemplary embodiment of manufacturing the first display substrate 110, the island electrode IE, the gate electrode GE, the gate lines GLi-1 and GLi, and the pad electrode PAD may be formed from a same material layer simultaneously. The collective layer in which the island electrode IE, the gate electrode GE, the gate lines GLi-1 and GLi, and the pad electrode PAD including the same material are formed simultaneously may be referred to as a first metallic layer.

The first insulating layer 112 is disposed on a portion of the base substrate 111 that corresponds to the non-pixel area NPA and covers the island electrode IE, the gate electrode GE and the gate lines GLi-1. The first contact hole CH1 that is defined in the first insulating layer 112 exposes a predetermined region of the island electrode IE. The first insulating layer 112 is further disposed on a portion of the base substrate 111 that corresponds to the non-display area NDA and covers the pad electrode PAD. The third contact hole CH3 that is defined in the first insulating layer 112 exposes a predetermined region of the pad electrode PAD. The first insulating layer 112 disposed in the display area DA may extend to define a portion thereof in the non-display area NDA. The first insulating layer 112 may be an inorganic insulating layer including an inorganic material. The first insulating layer 112 may be referred to as a gate insulating layer.

A semiconductor layer SM of the thin film transistor TFT is disposed on a portion of the first insulating layer 112 that corresponds to the non-pixel area NPA. The first contact hole CH1 that is defined in the semiconductor layer SM exposes the predetermined region of the island electrode IE. The semiconductor layer SM is further disposed on a portion of the base substrate 111 that corresponds to the non-display area NDA and overlaps the pad electrode PAD. The third contact hole CH3 that is defined in the semiconductor layer SM exposes the predetermined region of the pad electrode PAD. The semiconductor layer SM overlaps the gate electrode GE at least partially. Though not shown, the semiconductor layer SM may collectively include an active layer and an ohmic contact layer. Also, the semiconductor layer SM may include an oxide semiconductor. The oxide semiconductor may include an indium gallium zinc oxide ("IGZO").

The source electrode SE and the drain electrode DE are spaced apart from each other on the semiconductor layer SM. A portion of the semiconductor layer SM is exposed between the spaced apart source and drain electrodes SE and DE. The drain electrode DE may be defined as a portion of the data line DLj that overlaps the gate electrode GE. The source electrode SE directly contacts the island electrode IE at the first contact hole CH1 that is commonly defined in the semiconductor layer SM and the first insulating layer 112.

The semiconductor layer SM forms a conductive channel of the thin film transistor TFT between the source electrode SE and the drain electrode DE. The portion of the semiconductor layer SM at the thin film transistor TFT may be disposed in a same layer as a portion of the semiconductor layer SM disposed in the non-display are NDA.

The data lines DLj-1 and DLj are disposed on a portion of the first insulating layer that corresponds to the non-pixel area NPA. In the thickness direction of the display panel 100, the semiconductor layer SM is disposed between each of the data lines DLj-1 and DLj, and the first insulating layer 112, respectively.

The data line DLj is electrically connected to the pad electrode PAD at the third contact hole CH3 that is commonly defined in the semiconductor layer SM and the first insulating layer 112. The data lines DLj-1 and DLj, the source electrode SE and the drain electrode DE may include the same material and may be disposed in a same layer of the first display substrate 110 among layers disposed on the base substrate 111. In an exemplary embodiment of manufacturing the data lines DLj-1 and DLj, the source electrode SE and the drain electrode DE may be formed from a same material layer simultaneously. The layer in which the data lines DLj-1 and DLj, the source electrode SE and the drain electrode DE including the same material are formed simultaneously may be referred to as a second metallic layer.

The second insulating layer 113 is disposed on the base substrate 111 and covers the source electrode SE, the drain electrode DE, and the data lines DLj-1 and DLj. The second insulating layer 113 may be an inorganic insulating layer including an inorganic material. Also, the second insulating layer 113 may be defined as a passivation layer. The second insulating layer 113 covers the exposed portion of the semiconductor layer SM that corresponds to the conductive channel of the thin film transistor TFT. The second insulating layer 113 disposed in the display area DA may extend to define a portion thereof in the non-display area NDA.

The color filter CF may be disposed on a portion of the second insulating layer 113 that corresponds to the pixel area PA. The color filter CF provides color to light that passes through the pixel PXij. The color filter CF may be one of a red color filter, a green color filter and a blue color filter but is not limited thereto.

The third insulating layer 114 is disposed on a portion of the second insulating layer 113 that corresponds to the display area DA and covers the color filter CF. The third insulating layer 114 may be an organic insulating layer including an organic material. In the thickness direction of the display panel 100, the color filter CF may be disposed between the second insulating layer 113 and the third insulating layer 114 in the pixel area PA.

The common electrode CE may be disposed on the third insulating layer 114 in the display area DA. The common electrode CE includes the first opening OP1 defined therein. The first opening OP1 is disposed in the non-pixel area NPA. The first opening OP1 is a region not including (e.g., excluding) portions of the common electrode CE. The first opening OP1 defined in the common electrode CE overlaps the second contact hole CH2. The first opening OP1 is larger than the second contact hole CH2.

The common electrode CE may include a transparent conductive material. In an exemplary embodiment, for example, the common electrode CE may include a transparent conductive metallic oxide such as indium tin oxide ("ITO"), indium zinc oxide ("IZO") and indium tin zinc oxide ("ITZO").

The fourth insulating layer 115 is disposed on the third insulating layer 114 and covers the common electrode CE. That is, in the thickness direction of the display panel 100, the common electrode CE is disposed between the third insulating layer 114 and the fourth insulating layer 115. The fourth insulating layer 115 may be an inorganic insulating layer including an inorganic material. The fourth insulating layer 115 disposed in the display area DA may extend to define a portion thereof in the non-display area NDA.

The second contact hole CH2 is commonly defined in the second insulating layer 113, the third insulating layer 114 and the fourth insulating layer 115 and exposes the predetermined region of the source electrode SE of the thin film transistor TFT. The second contact hole CH2 overlaps the first opening OP1 of the common electrode CE.

The pixel electrode PE is disposed on a portion of the fourth insulating layer 115 that corresponds to the pixel area PA. The fourth insulating layer 115 electrically insulates the pixel electrode PE from the common electrode CE. The pixel electrode PE forms an electric field with the common electrode CE. The pixel electrode PE is electrically connected to the source electrode SE of the thin film transistor TFT at the second contact hole CH2. As illustrated in FIG. 2, the branch electrode BE that protrudes from the main portion of the pixel electrode PE is electrically connected to the source electrode SE of the thin film transistor TFT at the second contact hole CH2 in the non-pixel area NPA. Therefore, the source electrode SE of the thin film transistor TFT may be electrically connected to the pixel electrode PE.

The pixel electrode PE and the branch electrode BE may include a transparent conductive material. In an exemplary embodiment, for example, the pixel electrode PE and the branch electrode BE may each include a transparent conductive metallic oxide such as indium tin oxide ("ITO"), indium zinc oxide ("IZO") and indium tin zinc oxide ("ITZO").

The second insulating layer 113 is disposed on the first insulating layer 112 and covers the data line DLj in the non-display area NDA. Also, the fourth insulating layer 115 is disposed on the second insulating layer 113 in the non-display area NDA. A fourth contact hole CH4 is commonly defined in the second insulating layer 113 and the fourth insulating layer 115 and exposes a predetermined region of the data line DLj in the non-display area NDA.

The fourth contact hole CH4 overlaps the third contact hole CH3. The fourth contact hole CH4 may be larger than the third contact hole CH3. A connection electrode CNE is disposed on the region of the data line DLj that is exposed at the third contact hole CH3. The connection electrode CNE is electrically connected to the data line DLj at the third and fourth contact holes CH3 and CH4. Though not shown, the source driving chip may be electrically connected to the connection electrode CNE. Therefore, the data line DLj may be electrically connected to the source driving chip at the pad electrode PAD and the connection electrode CNE. The branch electrode BE, the connection electrode CNE, and the pixel electrode PE may include the same material and may be disposed in a same layer of the first display substrate 110 among layers disposed on the base substrate 111. In an exemplary embodiment of manufacturing the branch electrode BE, the connection electrode CNE, and the pixel electrode PE may be formed simultaneously. A layer in which the branch electrode BE, the connection electrode CNE, and the pixel electrode PE including the same material are formed simultaneously may be referred to as a third metallic layer.

The black matrix BM is disposed on a portion of the fourth insulating layer 115 that corresponds to the non-pixel area NPA. Therefore, the black matrix BM may be disposed on the branch electrode BE disposed in the non-pixel area NPA. The black matrix BM may block light leakage due to abnormal operations of liquid crystal ("LC") molecules that may occur at the edge of the pixel area PA, or color mixing that may appear at the edge of the color filter CF.

The display device 500 including the pixel electrode PE and the common electrode CE as illustrated in FIGS. 2 and 3 may be defined as a plane to line switching ("PLS") mode liquid crystal display device. During a PLS mode, a fringe electric field is formed by the pixel electrode PE to which a data voltage is applied and the common electrode CE to which a common voltage is applied. During the PLS mode, LC molecules of the image display layer LC are driven by the fringe field. Light transmittance is adjusted by the LC molecules that are driven by the fringe field, so that an image is displayed.

Though not shown, a backlight unit that generates and provides light to the display panel 100 may be disposed at the lower portion of the display panel 100.

Though the construction of the PLS mode display device has been described as an exemplary embodiment, the invention is applicable to an in-plane switching ("IPS") mode display device and a vertically-aligned ("VA") mode display device.

FIGS. 5A to 5E are diagrams explaining an exemplary embodiment of a method of manufacturing a thin film transistor substrate of a display device according to the invention.

Figure 5A:
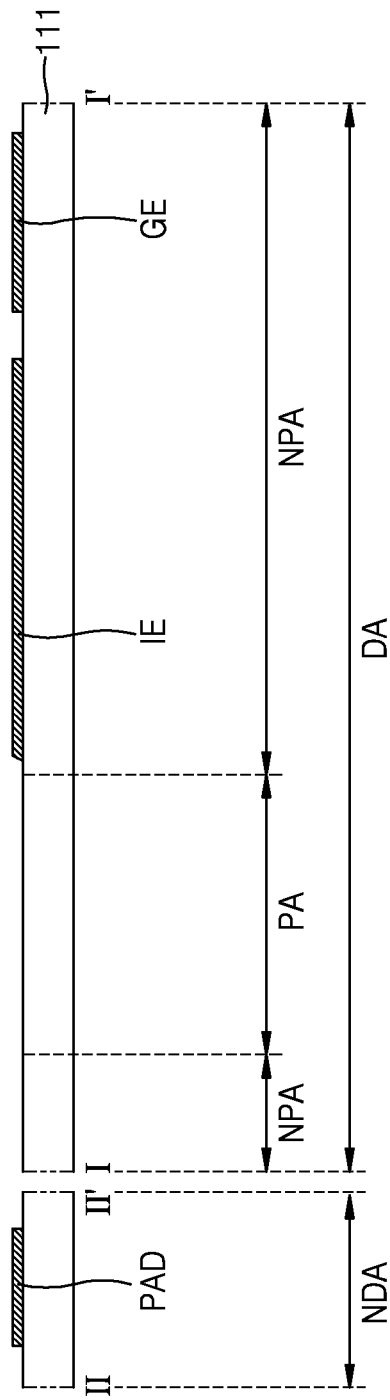

Referring to FIG. 5A, a base substrate 111 is prepared. An island electrode IE and a gate electrode GE electrically insulated from each other are formed on a portion of the base substrate 111 that corresponds to a non-pixel area NPA of the display area DA. Also, a pad electrode PAD is formed on a portion of the base substrate 111 that corresponds to a non-display area NDA. Though not shown, lengths of the gate lines GLi-1 and GLi extend in the first direction D1 on the base substrate 111.

The island electrode IE, the gate electrode GE, the gate lines GLi and GLi-1, and the pad electrode PAD may include the same conductive material and may be patterned in the same layer simultaneously. The conductive material may include a metal material such that the island electrode IE, the gate electrode GE, the gate lines GLi and GLi-1, and the pad electrode PAD form a first metallic layer of the first display substrate 110.

Referring to FIG. 5B, a first insulating layer 112 is formed on the base substrate 111 and covers the island electrode IE, the gate electrode GE and the pad electrode PAD. Though not shown, the first insulating layer 112 is formed on the base substrate 111 and covers the gate lines GLi and GLi-1.

The semiconductor layer SM is formed on the first insulating layer 112. The semiconductor layer SM overlaps the gate electrode GE at least partially. Also, the semiconductor layer SM overlaps the island electrode IE at least partially. Also, the semiconductor layer SM overlaps the pad electrode PAD at least partially.

A first contact hole CH1 that commonly passes through the first insulating layer 112 and the semiconductor material layer SM is formed to expose a predetermined region of the island electrode IE. Also, a third contact hole CH3 that commonly passes through the first insulating layer 112 and the semiconductor layer SM is formed to expose a predetermined region of the pad electrode PAD.

Figure 5C:
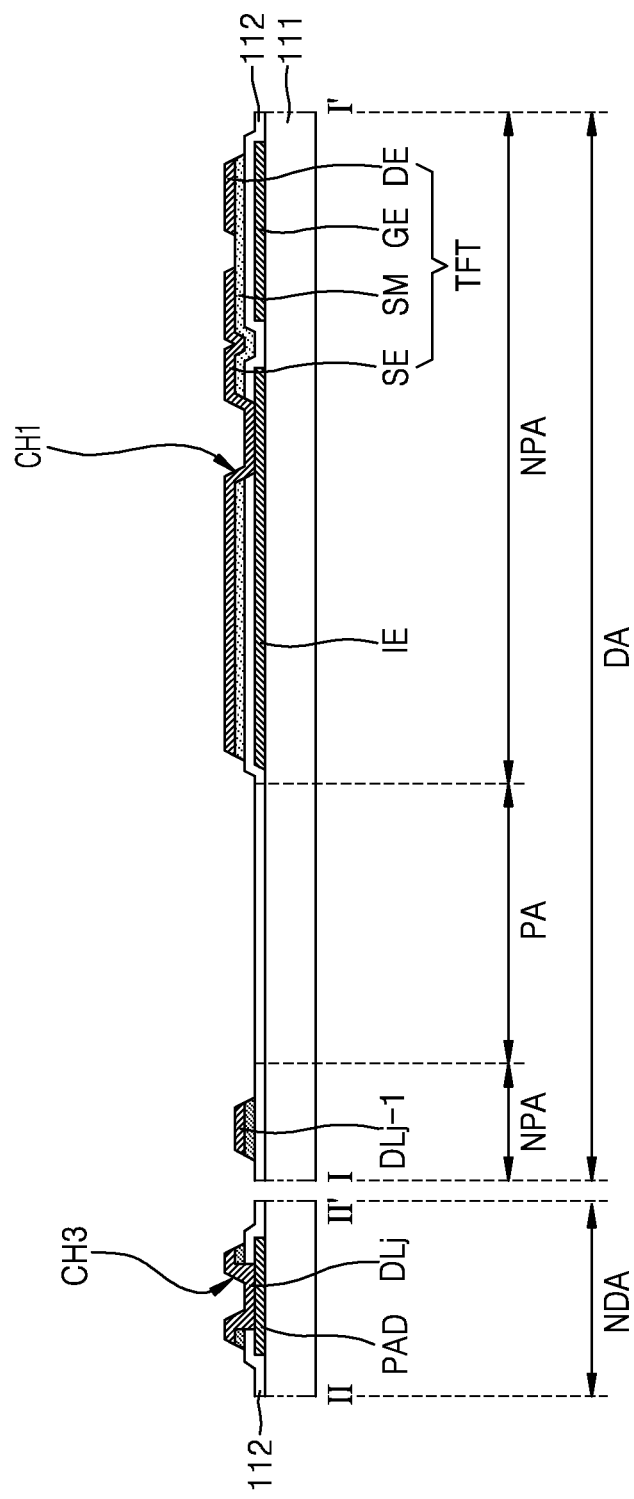

Referring to FIG. 5C, a source electrode SE and a drain electrode DE are formed spaced apart from each other on the semiconductor layer SM. The source electrode SE directly contacts the island electrode IE at the first contact hole CH1.

A length of the data line DLj extends in the second direction D2 and a distal end of the data line DLj is electrically connected to the pad electrode PAD at the third contact hole CH3. A data line DLj-1 is disposed on a portion of the first insulating layer 112 that corresponds to the non-pixel area NPA. Though not shown, the data line DLj is also disposed on a portion of the first insulating layer 112 that corresponds to the non-pixel area NPA. The semiconductor layer SM is disposed between each of the data lines DLj-1 and DLj, and the first insulating layer 112, respectively.

The data lines DLj-1 and DLj, the source electrode SE, and the drain electrode DE may include the same conductive material and may be patterned in the same layer simultaneously. The conductive material may include a metal material such that the data lines DLj-1 and DLj, the source electrode SE, and the drain electrode DE form a second metallic layer of the first display substrate 110.

Figure 5D:
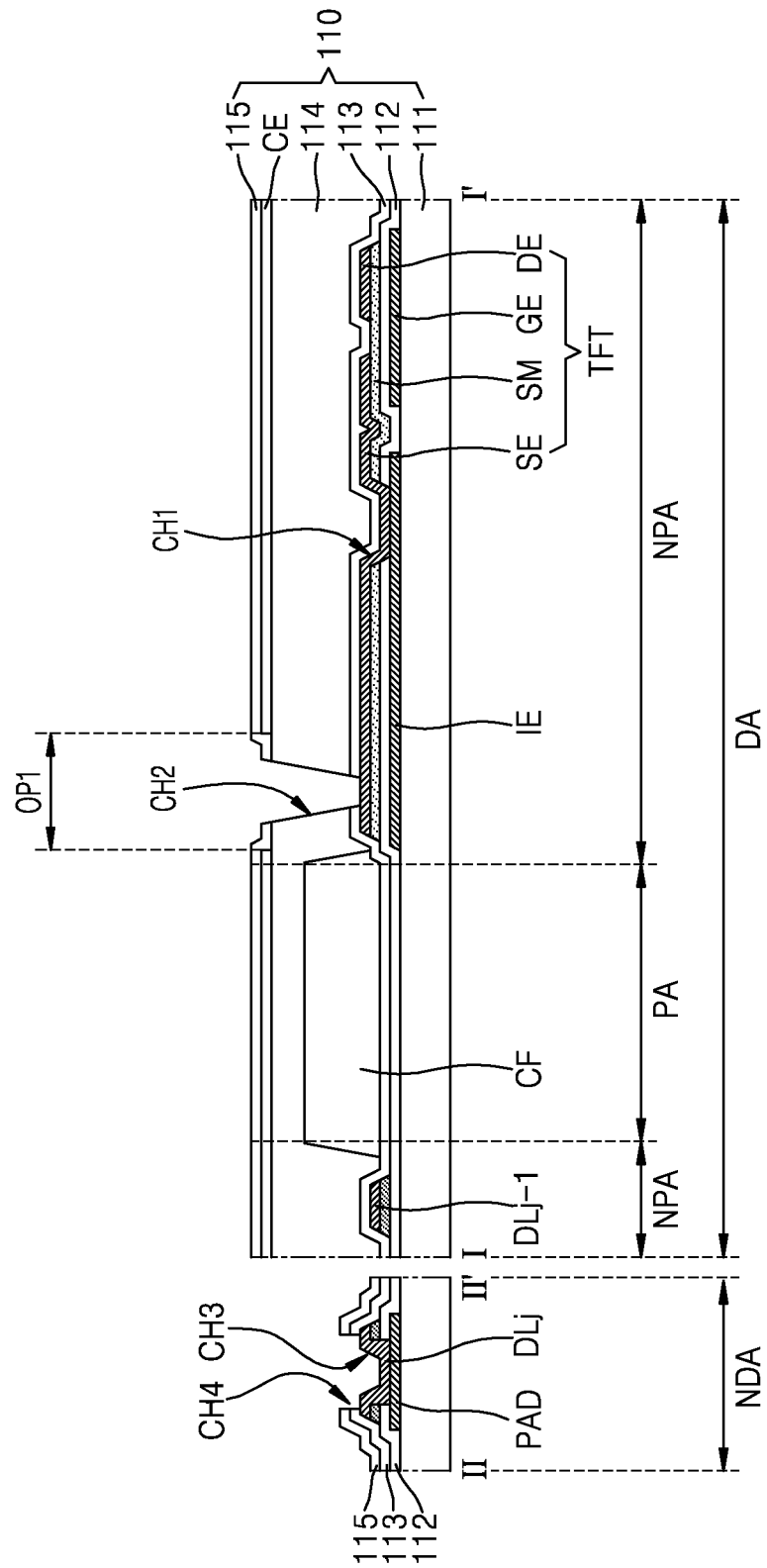

Referring to FIG. 5D, a second insulating layer 113 is formed on the base substrate 111 and covers the data line DLj-1, the source electrode SE and the drain electrode DE. Though not shown, the second insulating layer 113 is formed on the base substrate 111 and covers the data line DLj. A color filter CF is formed on a portion of the second insulating layer 113 that corresponds to a pixel area PA.

A third insulating layer 114 is formed on a portion of the second insulating layer 113 that corresponds to a display area DA and covers the color filter CF.

A common electrode CE is disposed on a portion of the third insulating layer 114 that corresponds to the display area DA. The common electrode CE includes a first opening OP1 defined therein at a region corresponding to the second contact hole CH2. The first opening OP1 of the common electrode CE is larger than the second contact hole CH2.

A fourth insulating layer 115 is formed on the third insulating layer 114 and covers the common electrode CE. The fourth insulating layer 115 is formed on a portion of the second insulating layer 113 that corresponds to the non-display area NDA.

The second contact hole CH2 that commonly passes through the fourth insulating layer 115, the third insulating layer 114 and the second insulating layer 113 is formed to exposes a predetermined region of the source electrode SE of the thin film transistor TFT.

The third contact hole CH3 that commonly passes through the fourth insulating layer 115 and the second insulating layer 113 is formed in the non-display area NDA and exposes a predetermined region of the data line DLj.

Referring to FIG. 5E, a pixel electrode PE is formed on a portion of the fourth insulating layer 115 that corresponds to the pixel area PA. The fourth insulating layer 115 electrically insulates the pixel electrode PE from the common electrode CE. A branch electrode BE that protrudes from a main portion of the pixel electrode PE is electrically connected to the source electrode SE of the thin film transistor TFT at the second contact hole CH2 in the non-pixel area NPA.

A connection electrode CNE is formed on a portion of the data line DLj that is exposed at a fourth contact hole CH4. The connection electrode CNE is electrically connected to the data line DLj.

The branch electrode BE, the connection electrode CNE and the pixel electrode PE may include the same conductive material, and may be patterned simultaneously. The conductive material may include a metal material such that the branch electrode BE, the connection electrode CNE and the pixel electrode PE form a third metallic layer of the first display substrate 110.

Referring to FIG. 3, the black matrix BM may be formed on a portion of the fourth insulating layer 115 that corresponds to the non-pixel area NPA. The second display substrate 120 is disposed to face the first display substrate 110. The image display layer LC is disposed between the first display substrate 110 and the second display substrate 120, so that the display device 500 may be manufactured.

While one or more exemplary embodiments have been described with reference to the figures, those of ordinary skill in the art will understand that various changes in form and details may be made therein without departing from the spirit and scope of the invention as defined by the following claims.

What is claimed is:

1. A thin film transistor substrate comprising:
a base substrate;
a first metallic layer comprising a gate electrode of a thin film transistor and an island electrode spaced apart from the gate electrode on the base substrate;
a semiconductor layer of which a portion thereof overlaps the gate electrode of the first metallic layer;
a first insulating layer between the gate electrode and the portion of the semiconductor layer and in which a contact hole is defined at an overlapping region of the source electrode and the island electrode; and
a second metallic layer comprising a source electrode and a drain electrode of the thin film transistor which are spaced apart from each other on the portion of the semiconductor layer,
wherein the source electrode of the thin film transistor directly contacts the island electrode at the contact hole defined in the first insulating layer.

2. The thin film transistor substrate of claim 1, wherein
a contact hole is defined in the portion of the semiconductor layer at the overlapping region of the source electrode and the island electrode, and
the source electrode and the island electrode directly contact each other at the contact hole defined in the portion of the semiconductor layer and at the contact hole defined in the first insulating layer.

3. The thin film transistor substrate of claim 1, further comprising:
a plurality of pixels,
wherein each of the pixels comprises the island electrode and the thin film transistor comprising the gate electrode, the portion of the semiconductor layer, the source electrode and the drain electrode.

4. The thin film transistor substrate of claim 1, wherein the first metallic layer further comprises:
the gate electrode provided in plural electrically connected to each other, and
the island electrode provided in plural electrically insulated from each other and from the plural gate electrodes, and
the plural island electrodes and the plural gate electrodes are alternately arranged.

5. The thin film transistor substrate of claim 4, wherein
the first metallic layer further comprises a gate line extending along a row direction, and
the gate line defines the plural gate electrodes electrically connected to each other in the row direction and electrically insulated from and alternately arranged with the plural island electrodes.

6. The thin film transistor substrate of claim 1, further comprising:
a third metallic layer on the second metallic layer and comprising a pixel electrode electrically connected to the source electrode of the thin film transistor.

7. The thin film transistor substrate of claim 1, wherein the semiconductor layer comprises an oxide semiconductor.

8. The thin film transistor substrate of claim 7, wherein the oxide semiconductor comprises an indium-gallium-zinc oxide.

9. A thin film transistor substrate comprising:
a base substrate comprising:
a display area in which an image is displayed and in which pixels are arranged, and
a non-display area which is adjacent to the display area;
a first metallic layer comprising:
a gate electrode of a thin film transistor,
an island electrode spaced apart from the gate electrode on the base substrate, and
a pad electrode in the non-display area;
a semiconductor layer of which a portion thereof overlaps the gate electrode of the first metallic layer; and
a second metallic layer comprising:
a source electrode and a drain electrode of the thin film transistor which are spaced apart from each other on the portion of the semiconductor layer, and
a data line which directly contacts the pad electrode of the first metallic layer,
wherein the source electrode of the thin film transistor overlaps the island electrode.

10. The thin film transistor substrate of claim 7, wherein the second metallic layer further comprises:
the source electrode provided in plural,
the drain electrode provided in plural electrically connected to each other, and
the data line extending along a column direction, and
the data line defines the plural drain electrodes electrically connected to each other in the column direction.

11. A display device comprising:
a first display substrate defining a display area in which a plurality of pixels is arranged and a non-display area which surrounds the display area;
a second display substrate facing the first display substrate; and
a liquid crystal layer between the first display substrate and the second display substrate facing each other,
wherein each of the pixels comprises:
a first metallic layer comprising a gate electrode of a thin film transistor and an island electrode spaced apart from the gate electrode on a base substrate;
a semiconductor layer of which a portion thereof overlaps the gate electrode of the first metallic layer;
a first insulating layer between the gate electrode and the portion of the semiconductor layer and in which a contact hole is defined at an overlapping region of the source electrode and the island electrode; and
a second metallic layer comprising a source electrode and a drain electrode of the thin film transistor spaced apart from each other on the portion of the semiconductor layer,
wherein the source electrode of the thin film transistor directly contacts the island electrode at the contact hole defined in the first insulating layer.

12. The display device of claim 11, wherein
a contact hole is defined in the portion of the semiconductor layer at the overlapping region of the source electrode and the island electrode, and
the source electrode and the island electrode directly contact each other at the contact hole defined in the portion of the semiconductor layer and at the contact hole defined in the first insulating layer.

13. The display device of claim 11, wherein each of the pixels further comprises a third metallic layer on the second metallic layer and comprising a pixel electrode electrically connected to the source electrode of the thin film transistor.

14. The display device of claim 13, wherein each of the pixels further comprises:
the thin film transistor comprising the gate electrode, the portion of the semiconductor layer, the source electrode and the drain electrode;
the island electrode which directly contacts the source electrode; and
the pixel electrode which is electrically connected to the source electrode.

15. The display device of claim 11, wherein
the first metallic layer further comprises a pad electrode in the non-display area, and
the second metallic layer further comprises a data line which directly contacts the pad electrode and electrically connects the drain electrode in the display area with the pad electrode in the non-display area.

16. The display device of claim 11, wherein the semiconductor layer comprises an oxide semiconductor.

* * * * *